(12) United States Patent
Roux

(10) Patent No.: US 7,692,766 B2
(45) Date of Patent: Apr. 6, 2010

(54) LITHOGRAPHIC APPARATUS

(75) Inventor: Stephen Roux, New Fairfield, CT (US)

(73) Assignee: ASML Holding NV, Veldhoven (NL)

( * ) Notice: Subject to any disclaimer, the term of this patent is extended or adjusted under 35 U.S.C. 154(b) by 239 days.

(21) Appl. No.: 11/797,649

(22) Filed: May 4, 2007

(65) Prior Publication Data

US 2008/0273180 A1    Nov. 6, 2008

(51) Int. Cl.
*G03B 27/42* (2006.01)
*G02B 7/02* (2006.01)

(52) U.S. Cl. .......................................... 355/53; 359/820

(58) Field of Classification Search ................... 355/30; 359/395, 512, 820
See application file for complete search history.

(56) References Cited

U.S. PATENT DOCUMENTS

| | | | |
|---|---|---|---|
| 5,610,684 A * | 3/1997 | Shiraishi ....................... | 355/55 |
| 6,114,671 A | 9/2000 | Wehner et al. | |
| 2001/0019403 A1* | 9/2001 | Schuster et al. ................ | 355/67 |
| 2004/0051984 A1 | 3/2004 | Oshino et al. | |
| 2004/0228012 A1* | 11/2004 | Sakamoto ..................... | 359/820 |

FOREIGN PATENT DOCUMENTS

JP     2005-140999     6/2005

OTHER PUBLICATIONS

"Cooling and shielding an optical element in lithographic projection apparatus by use of a lens cooler plate to remove heat dissipated by the optical element", Research Disclosure, vol. 438, 10 2000, p. 1756 (RD 438042).

* cited by examiner

*Primary Examiner*—Edward J Glick
*Assistant Examiner*—Mesfin T. Asfaw
(74) *Attorney, Agent, or Firm*—Pillsbury Winthrop Shaw Pittman, LLP

(57) ABSTRACT

A projection system suitable for use in a lithographic apparatus, the projection system including a transmissive optical element and a thermal profile corrector configured to change a thermal profile of the transmissive optical element, the thermal profile corrector including a transfer member and a thermal profile conditioner, the transfer member being moveable into and out of proximity with the transmissive optical element to transfer a desired thermal profile from the thermal profile conditioner into the transmissive optical element.

35 Claims, 5 Drawing Sheets

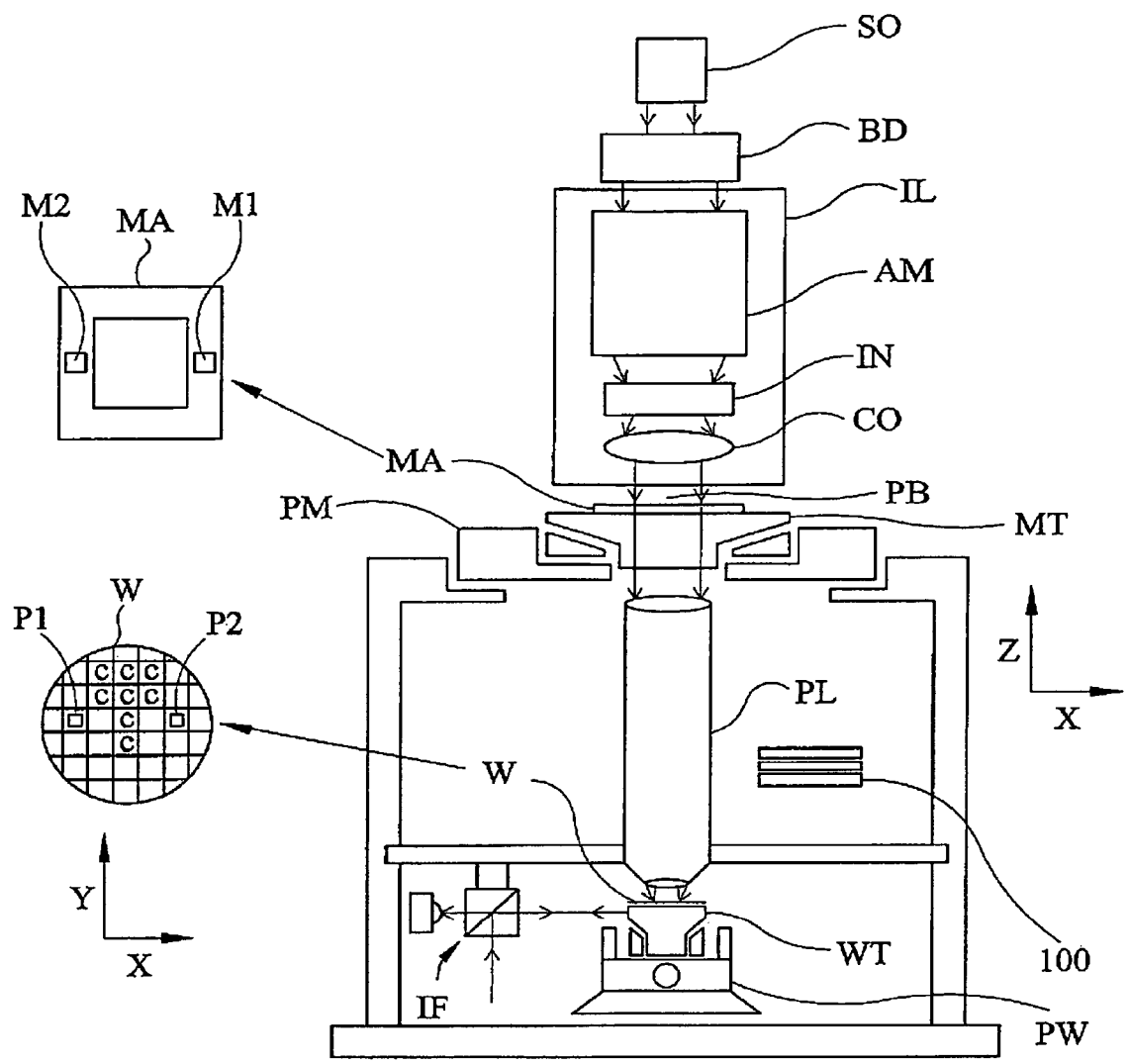
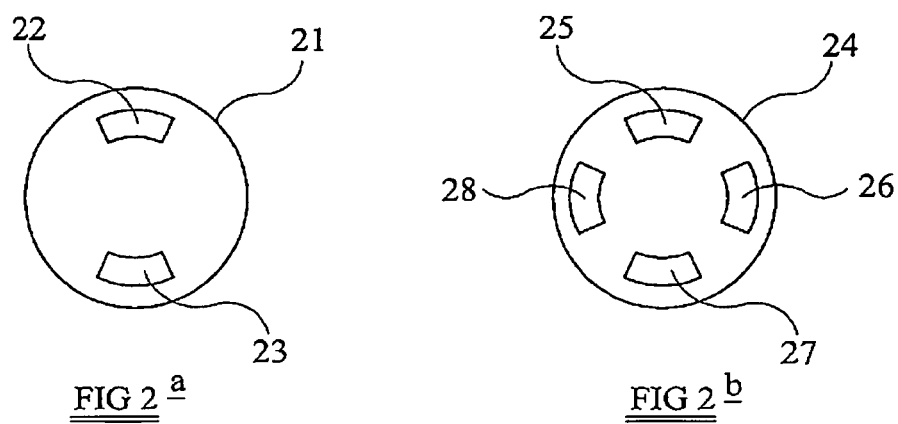
FIG 1
FIG 2 a        FIG 2 b

LITHOGRAPHIC APPARATUS

FIELD

The present invention relates to a projection system for a lithographic apparatus, a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the beam in a given direction (the "scanning"-direction) while synchronously scanning the substrate parallel or anti-parallel to this direction.

In IC fabrication, the continuing improvements in microprocessor speed, memory packing density and low power consumption for micro-electronic components require a continuing decrease of size of the patterns that are transferred from the patterning device (e.g. mask) to the substrate by lithographic apparatus. However, as the size of an integrated circuit is reduced and its density increases, the CD (critical dimension) of its corresponding patterning device (e.g. mask) pattern approaches the resolution limit of the lithographic apparatus. The resolution of lithographic apparatus is defined as the minimum feature that the exposure tool can repeatedly expose on the substrate (e.g. wafer). Various techniques, known as resolution enhancement techniques, have been applied in order to extend the resolution limit of the lithographic apparatus.

One technique to improve resolution is off-axis illumination. With this technique, the patterning device (e.g. mask) is illuminated at selected non-perpendicular angles which may improve resolution, and particularly improves the process latitude by increasing the depth of focus and/or contrast. The angular distribution of the radiation beam at the patterning device (e.g. mask) plane, which is an object plane, corresponds to a spatial distribution of the radiation beam in a pupil plane of optical arrangements of the lithographic apparatus. Typically, the shape of the spatial distribution in a pupil plane is referred to as illumination mode. One known illumination mode is annular, in which the conventional zero order spot on the optical axis is changed to a ring-shaped intensity distribution. Another mode is multipole illumination in which several spots or beams are produced which are not on the optical axis. Examples of multipole illumination modes are dipole, including two poles, and quadrupole, including four poles. For illumination modes such as dipole and quadrupole, the size of the poles in the pupil plane can be very small compared to the total surface of the pupil plane. Consequently, all of the radiation used for exposing the substrate traverses the various optical elements at or near the pupil planes at the locations of these poles only. The optical element maybe, for example, a lens element. A fraction of the radiation traversing the lens element is absorbed by the lens element. This leads to a non-uniform heating of the lens element by the radiation beam, resulting in a local change in refractive index and a deformation of the lens element. The local change in refractive index and deformation of this lens element results in optical aberrations and a distorted image as projected by the projection system onto the resist layer. Local changes in refractive index and deformation of the lenses may alternatively, or additionally, be a symptom of aging.

It is desirable to provide, for example, a lithographic apparatus and method which obviate or mitigate one or more of the problems of the prior art, whether identified herein or elsewhere.

SUMMARY

According to an aspect of the present invention there is provided a projection system suitable for use in a lithographic apparatus, the projection system including at least one transmissive optical element, the projection system being provided with a thermal profile corrector configured to effect a change in the thermal profile of the transmissive optical element, the thermal profile corrector including a transfer member and a thermal profile conditioner, the transfer member being moveable into and out of proximity with the transmissive optical element to transfer a desired thermal profile from the thermal profile conditioner into the transmissive optical element.

According to a further aspect of the present invention there is provided a lithographic apparatus including: an illumination system configured to condition a radiation beam; a support constructed to support a patterning device, the patterning device being capable of imparting the conditioned radiation beam with a pattern in its cross-section to form a patterned radiation beam; a substrate table constructed to hold a substrate; and a projection system provided with at least one transmissive optical element, and configured to project the patterned radiation beam onto a target portion of the substrate, the projection system being provided with a thermal profile corrector configured to effect a change in the thermal profile of the transmissive optical element, the thermal profile corrector including a transfer member and a thermal profile conditioner, the transfer member being moveable into and out of proximity with the transmissive optical element to transfer a desired thermal profile from the thermal profile conditioner into the transmissive optical element.

According to a further aspect of the present invention there is provided a method of effecting a change in the thermal profile of a transmissive optical element, including: transferring a predetermined thermal profile from a thermal profile conditioner to a transfer member, and moving the transfer member into proximity with the transmissive optical element to transfer the thermal profile from the transfer member to the transmissive optical element arrangement.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 is a schematic drawing of lithographic apparatus according to an embodiment of the invention;

FIG. 2a is a schematic drawing of a dipole intensity distribution of a radiation beam in a pupil plane;

FIG. 2b is a schematic drawing of a quadrupole intensity distribution of a radiation beam in a pupil plane;

DETAILED DESCRIPTION

Figure 3:
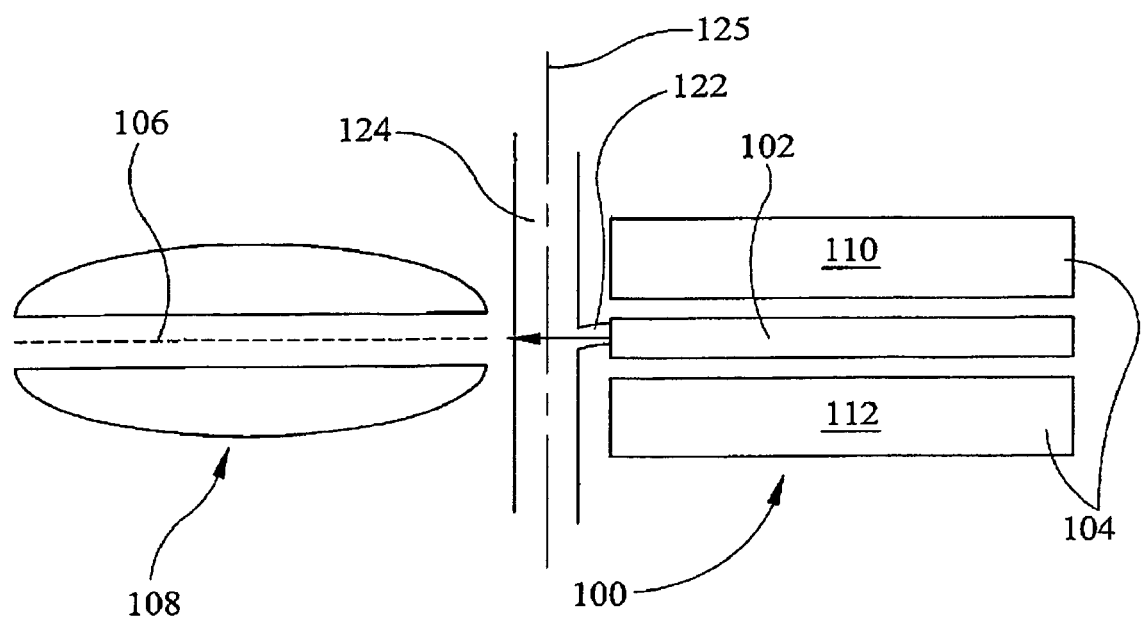
FIG. 3 is a schematic drawing of a thermal profile corrector, according to an embodiment of the present invention, arranged to transfer heat between a thermal profile conditioner and a heat transfer member.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the patterning device (e.g. mask) and the first element of the projection system. Immersion techniques are well known in the art for increasing the numerical aperture of projection systems.

FIG. 1 schematically depicts a lithographic apparatus according to a particular embodiment of the invention. The apparatus includes an illumination system (illuminator) IL to condition a beam PB of radiation (e.g. UV radiation); a support structure (e.g. a support structure) MT to support a patterning device (e.g. a mask) MA and connected to first positioning device PM to accurately position the patterning device with respect to item PL; a substrate table (e.g. a wafer table) WT configured to hold a substrate (e.g. a resist-coated wafer) W and connected to second positioning device PW configured to accurately position the substrate with respect to item PL; a projection system (e.g. a refractive projection lens) PL configured to image a pattern imparted to the radiation beam PB by patterning device MA onto a target portion C (e.g. including one or more dies) of the substrate W; and a thermal profile corrector 100 configured to effect a change in or change the thermal profile of transmissive optical elements (e.g. lenses) of the projection system PL.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjuster AM configured to, among other things, adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2a shows an example of an intensity distribution of the radiation beam in a pupil plane 21 in the illuminator or projection system. The intensity distribution of the radiation beam includes two poles 22 and 23, defining the portion of the cross-section of the pupil plane through which the majority of radiation of the radiation beam traverses the pupil plane (some radiation being lost due to scattering and/or fading at the edge of the poles). FIG. 2b shows a second example of an intensity distribution in a pupil plane 24, including four poles 25, 26, 27 and 28. In the following description, the intensity distribution of the radiation beam in a pupil plane is referred to as illumination mode. The intensity distribution shown in FIG. 2a is called a dipole illumination mode. The intensity distribution shown in FIG. 2b is called a quadrupole illumination mode.

As the radiation beam traverses a refractive lens element (e.g. a lens of the projection system PL of FIG. 1), a small portion of the radiation beam is absorbed by the lens element. The absorption of the radiation beam by the lens element causes the lens element to heat up. Heating of the lens element results in a change in the refractive index of the lens element at the location of the absorption and a deformation thereof. For the lens elements positioned at that location where the radiation beam traverses the lens element uniformly, the absorption results in a uniform heating of the lens element and a uniform change in refractive index. For a lens element positioned at or near a pupil plane, the portion of the cross-section of the lens element through which the radiation beam traverses the lens element is dependent on the applied illumination mode. For illumination modes such as dipole and quadrupole, the lens element absorbs radiation non-uniformly across the surface of the lens element. The local changes in refractive index and deformation of one or more lens elements in the projection system results in a change in the optical path length of different portions of the radiation beam traversing the lens elements. Because their optical path lengths, are different, the portions of the radiation beam recombine into an image at substrate level which is distorted with respect to the object image at reticle level.

Referring to FIG. 3, a thermal profile corrector 100 (as shown in FIG. 1), according to an embodiment of the present invention includes a heat transfer member 102 and a thermal profile conditioner 104. The heat transfer member 102 is of a plate-like shape. The heat transfer member 102 is constructed so that a thermal profile can be established on or within it, but also so that heat can be readily dissipated from its surface (onto/into, for example, lenses of a lens arrangement). The heat transfer member 102 may therefore be conveniently formed from a matrix of conductive (e.g. a metal, such as copper) elements, so that heat can be readily absorbed and dissipated from the transfer member 102. The elements may each be surrounded by a thermal insulator, which thermally isolates each of the elements from one another, thereby allowing a thermal profile to be established.

The heat transfer member 102 is dimensioned such that it is disposable between lenses of a lens arrangement 108. The lens arrangement 108 forms part of the projections system PL shown in FIG. 1. The heat transfer member may be disposed on or near a pupil plane 106 associated with the lens arrangement 108, or at any other suitable location in the proximity of the lenses of the lens arrangement 108, so that the lenses may be heated by the heat transfer member 102 (as discussed below).

The thermal profile conditioner 104 includes a pair of heating plates, 110 and 112, spaced apart from one another sufficiently to allow the heat transfer member 102 to be disposed therebetween, yet sufficiently close to one another to allow for the transfer of heat between the plates, 110 and 112, and the respective surfaces of the heat transfer member 102 when disposed adjacent thereto. The thermal profile conditioner 104 is described as having two heating plates 110, 112. However, as will be appreciated by one of ordinary skill in the art, a thermal profile conditioner 104 having a single heating plate may alternatively be used within the working of the present invention.

Figure 4:
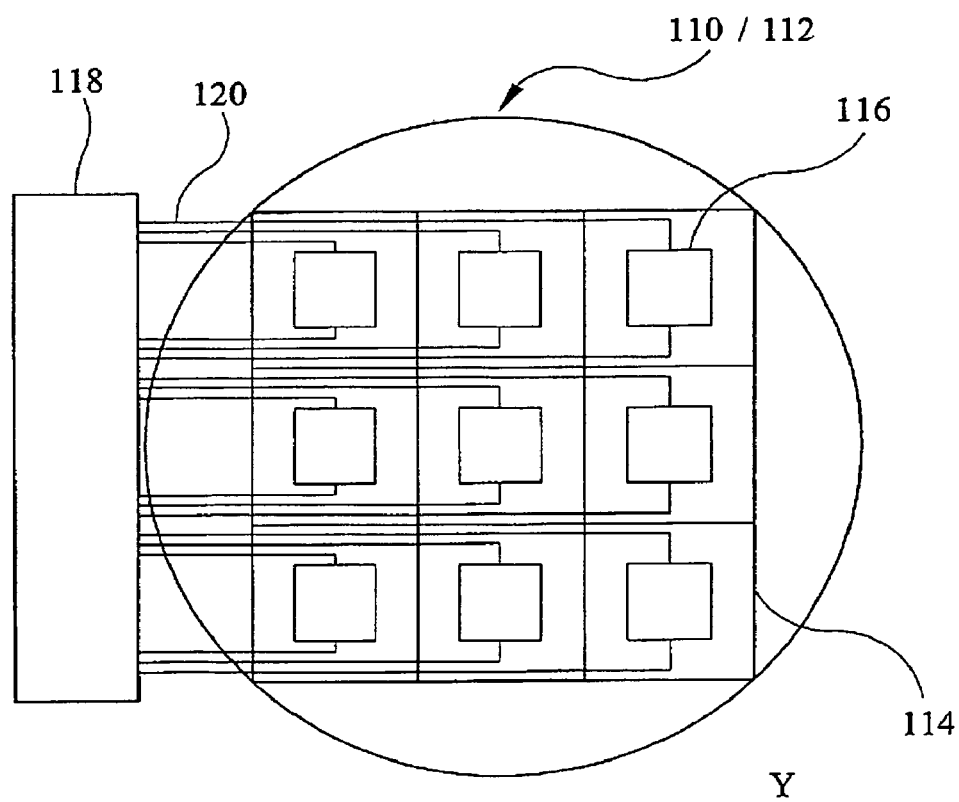
FIG. 4 is a schematic drawing showing an array of electrical heaters disposed on the thermal profile conditioner of the thermal profile corrector of FIG. 3.

Referring also to FIG. 4, each plate, 110 and 112, includes a heating array 114 having individually addressable electrical heaters 116 arranged to heat selected discrete localized regions of the heat transfer member 102. The drawing shows an array of nine electrical heaters for illustrative purposes only. In practice, the number of electrical heaters may be substantially larger, such as, for example, 128 or 256 heaters. The electrical heaters 116 are electrically connected to a control unit 118 via conductors 120. In use, the control unit 118 is configured to adjust the heat dissipation of each electrical heater 116 independently to define a predetermined thermal profile.

The optical path length variation as a function of position in the pupil plane, in the lens arrangement 108, can be described by a surface profile and is referred to as a phase map. The desired correction of the optical path lengths of different portions of the radiation beam can be obtained by measuring the phase map of a radiation beam in a pupil plane (or at any other suitable part) of the lens arrangement using a known interferometer arrangement. Determining the change in optical path length directly by measuring a phase map in a pupil plane provides for an accurate correction to be determined and applied. Such measurements can be carried out during periods when the lithographic apparatus is not in continuous operation or when the lithographic apparatus is operated subsequently at settings with different illumination modes, resulting in a continuously changing phase map. Conventional lithographic tools may be equipped with a known sensor that includes an interferometric wavefront measurement system arranged at or near a substrate support means for in-situ measurement of the wave front.

The control unit 118 is configured to address the heaters 116 relevant to the measured phase map. In use, the phase map is measured using the interferometer arrangement. The phase map provides phase changes of different sub-beams of the radiation beam that traverse the lens arrangement 108. These are used to determine the desired correction of the irradiation induced optical path length differences. A desired change in refractive index for the lens arrangement 108 is calculated from the corresponding phase change determined on the phase map. Subsequently, the amount of heat dissipated from each electrical heater 116 is calculated to effect the transfer of heat desired between the heat transfer member and the lens arrangement to thereby effect a change in the thermal profile of the lens arrangement and consequently the refractive index profile thereof. Each electrical heater 116 is then individually addressed by the control unit 118 to dissipate the calculated amount of heat. The amount of heat to be dissipated from each electrical heater is calculated to effect transfer of a specific number of Joules between the heat transfer member and the lens arrangement within a set period of time.

The phase map may be determined and the corrections applied to the lens arrangement once for each employed illumination mode. Alternatively, the phase map may be determined and the corrections applied to the lens arrangement periodically. Alternatively, the phase map may be determined and the corrections applied to the lens arrangement at other intervals of time or during periods when the lithographic apparatus is not in operation such as, for example, between exposure of substrates, when changing a patterning device (e.g. mask), changing a substrate (e.g. wafer) batch, or during routine calibration of the apparatus. The control unit 118 may additionally, or alternatively, address the electrical heaters 116 relative to a history of applied illumination modes. Alternatively, the correction of irregularities in the radiation beam caused by aberration in the lenses may be more important than overall throughput of patterned substrates. In this case, the phase map can be calculated and corrections applied to the lenses at specific (e.g. maintenance) periods.

Alternatively, the phase map may be derived from the applied illumination mode. The calculation of the phase map can be carried out using conventional ray-tracing software and applied to the electrical heaters 116 via the control unit 118 accordingly.

Figure 5:
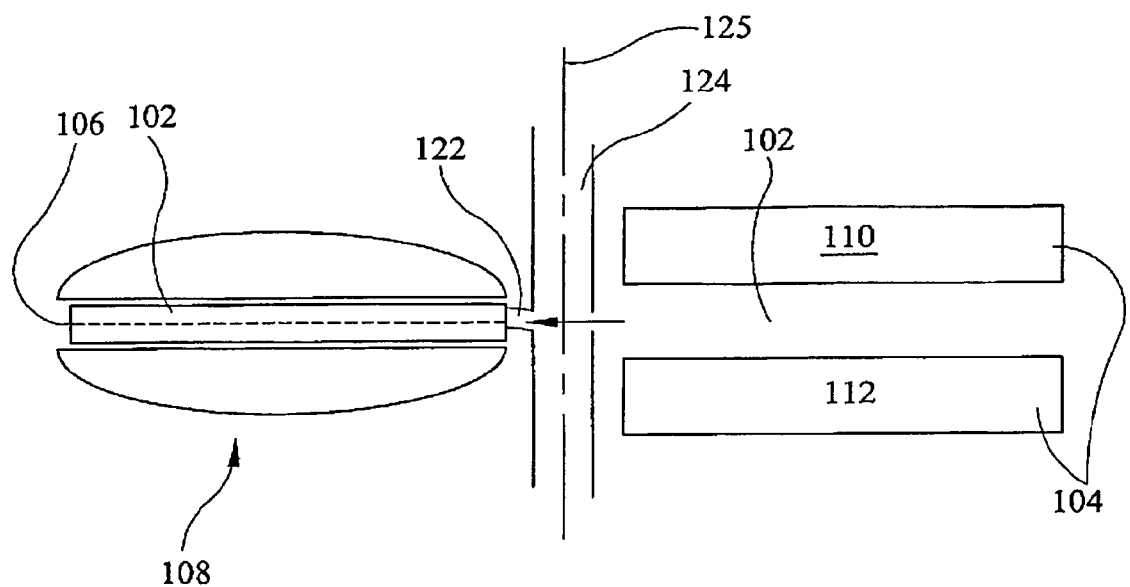
FIG. 5 is a schematic drawing of the thermal profile corrector of FIG. 3, arranged to transfer heat between the heat transfer member and a lens arrangement.

The calculated heat is dissipated from the electrical heaters 116 and transferred to the heat transfer member 102. It will be appreciated that the embodiment shown in the drawings has two heating plates, 110 and 112. However, the transfer of heat between the thermal profile conditioner 104 and the heat transfer member 102 may, alternatively, be effected using only one heating plate. The heat transfer member 102 is subsequently moved and disposed on the pupil plane 106 of the lens arrangement 108, as shown in FIG. 5. In this position, heat is transferred between discrete localized regions of the heat transfer member 102 and the lenses of the lens arrangement 108 so that the predetermined required number of Joules is transferred in the predetermined period of time, thereby changing the thermal profile of the lenses of the lens arrangement 108 and consequently altering the refractive index profile thereof.

Figure 6:
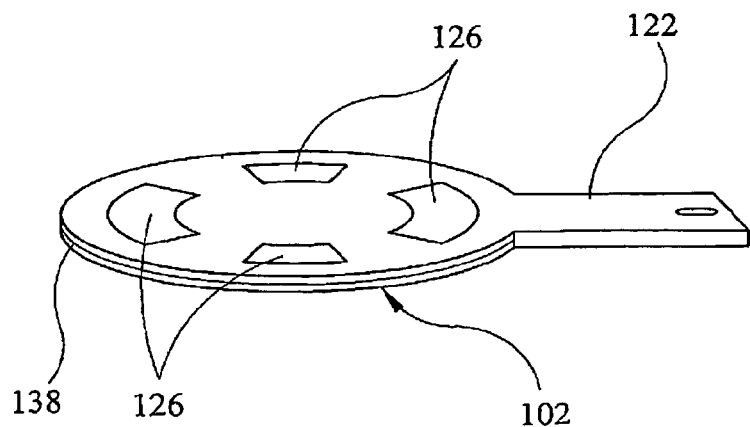
FIG. 6 is a schematic drawing of a heat transfer member of the thermal profile conditioner of FIG. 3.

Referring also to FIG. 6, the heat transfer member 102 has an arm 122 for connection to an upright member 124, as shown in FIGS. 3 and 5. The heat transfer member may also have a cooler 138, in the form of a cooling ring, configured to regulate the bulk temperature of the heat transfer member. FIG. 6 also shows an example of the discrete localized regions 126, of the heat transfer member, heated by the electrical heaters of the thermal profile conditioner 104.

Figure 7:
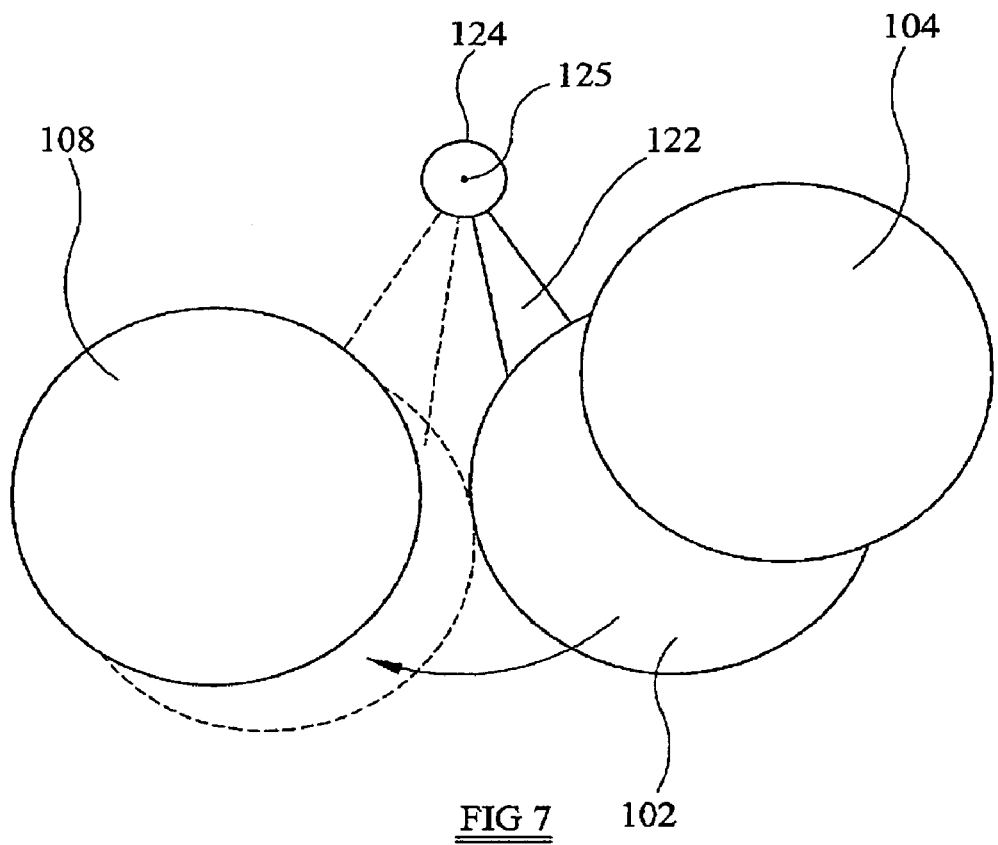
FIG. 7 is a schematic drawing in plan view of the thermal profile corrector of FIG. 3.

FIG. 7 shows a plan view of the thermal profile corrector 100, according to an embodiment of the present invention. Following transfer of the calculated heat from the electrical heaters 116 to the heat transfer member 102, the heat transfer member is moved from the thermal profile conditioner onto the pupil plane of the lens arrangement by rotating the heat transfer member 102 about a longitudinal axis 125 of the upright member 124, thereby transporting the heat transfer member 102 from the thermal profile conditioner 104 to the lens arrangement 108.

Figure 8:
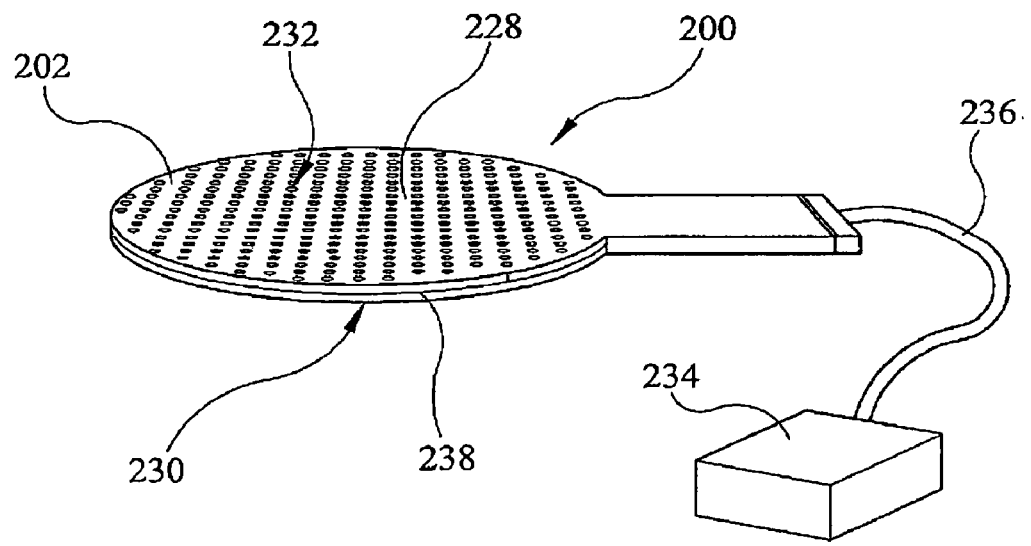
FIG. 8 is a schematic drawing of a thermal profile corrector according to an embodiment of the present invention.

Referring to FIG. 8, a thermal profile corrector 200 in accordance with an embodiment of the present invention includes a heat transfer member 202. The heat transfer member is of a similar shape to that of FIG. 3 and has a first surface 228 and a second surface 230. Either, or both, surfaces have disposed thereon an array of heat sources 232, such as, for example, Light Emitting Diode (LED), laser diode or super luminescent diode heat sources. The thermal profile corrector 200 further includes a thermal profile conditioner in the form of a controller 234 which actuates the heat sources 232, by individually addressing them, via data cables 236, relative to a phase map. The heat transfer member 232 is then disposed on the pupil plane of the lens arrangement, as described above in relation to the embodiment shown in FIG. 3, and the desired thermal profile is transferred to the lens arrangement thereby correcting the refractive index profile thereof. As described in relation to the embodiment of FIG. 3, the heat transfer member 202 may additionally have a cooler 238, in the form of a cooling loop, to regulate the bulk temperature of the heat transfer member 202. The controller 234 also controls the cooler 238.

In the embodiments described above, the thermal profile conditioner 104 may include an array of heaters 116 arranged to heat selected discrete localised regions of the heat transfer member 102. Instead of heating, cooling of the transfer member 102 could be employed. For example, instead of heaters 116, an array of cooling sources could be employed to selectively cool parts of the heat transfer member 102. The cooling sources could be provided in the form of selectively cooled metal plates, wires or the like, with cooled gas or liquid, or any other suitable means of cooling, being used to cool the plates, wires or the like.

In the embodiment described above in FIG. 8, a heat transfer member 202 is shown provided with a plurality of heat sources configured to heat, for example, selected parts of lenses of a lens arrangement. Instead, the transfer member 202 could be provided with a plurality of cooling sources configured to cool, for example, selected parts of lenses of a lens arrangement.

Parts of the heat transfer member may be cooled, whereas others may be heated, in order to provide the heat transfer member with a thermal profile. The overall energy (thermal) transfer to the lens arrangement may be negative, in that heat may be extracted from the lens arrangement. This can be achieved by ensuring that parts of the heat transfer member are made to be cooler than the ambient temperature of the lens arrangement, and that the overall cooling effect of these cooled parts is greater than the overall heating effect of heated parts of the transfer member. If heat is extracted from the lens arrangement, more accurate control of its thermal profile may be achieved to reduce any aberrations that it may have.

In the embodiments described above, the projections system PL has been described as including a lens arrangement 108. Other transmissive optical elements may be employed instead of or in addition lenses, for example any suitable refractive or diffractive optical element. The lens may have no optical power, and may be, for example, a flat piece of glass or other material transparent to radiation at certain (e.g. UV) wavelengths.

In the above embodiments, the thermal profile has been described as being controlled relative to a phase map of the radiation beam. This is not essential. Instead, the lens arrangement (e.g. the projection system) could be modeled to determine which parts of the lens in the arrangement will need to have a thermal profile applied to them, and what that thermal profile needs to be. A thermal profile can be established and applied to the lenses of the lens arrangement in accordance with this model. The thermal profile could also be applied to lenses of the arrangement relative to a history of known or calculated thermal profiles for previous applied illumination modes, exposure patterns etc.

In the embodiments described above, the heat transfer member has been described as being moveable to and from a position between lenses of a lens arrangement. It may be preferable to move the heat transfer member onto or into a pupil plane associated with the lens arrangement. However, this is not essential, and the heat transfer member may be moveable to and from any position between lenses of a lens arrangement.

In the embodiments described above, the heat transfer member has been described as being moveable to and from a position between lenses of a lens arrangement to heat both of the lenses either side of the lens arrangement. It may only be desirable or preferable to heat one lens of the arrangement, meaning that only side of the heat transfer member needs to have a thermal profile applied to it, or that only one side of the heat transfer member needs to be provided with heat sources. It maybe that different heat profiles need to be applied to different sides of the heat transfer member. In order to prevent the different profiles from merging together by conduction through the heat transfer member, an insulating or heat reflecting layer may be provided in the heat transfer member to separate one of its sides from the other.

Figure 9:
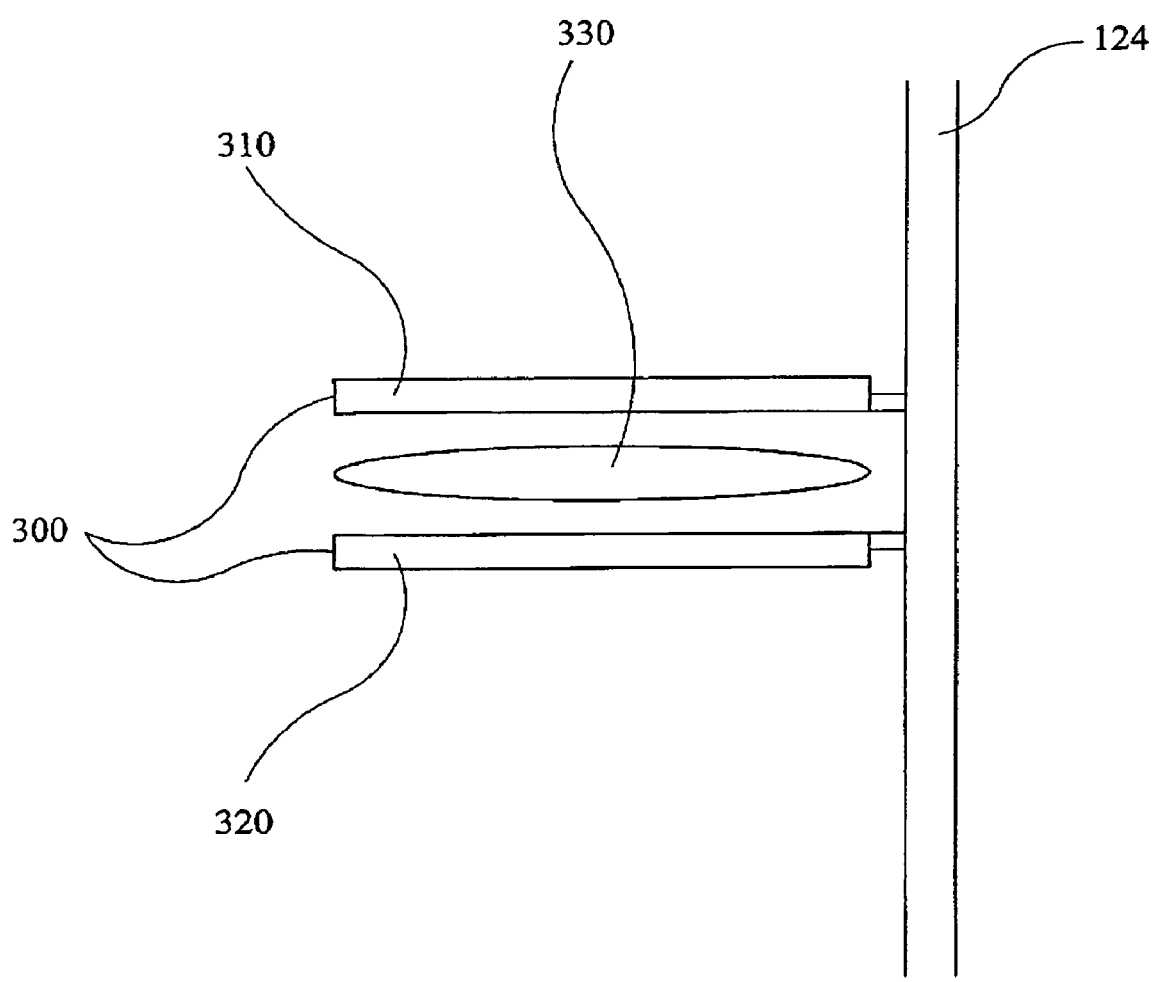
FIG. 9 is a is a schematic drawing of a thermal profile corrector according to an embodiment of the present invention.

Instead of being moveable to and from a position between lenses of a lens arrangement, the heat transfer member could be constructed such that is moveable to and from a position which results in a lens being surrounded by the heat transfer element. Such a construction is shown in FIG. 9. In FIG. 9, a heat transfer member 300 includes two parts: an upper heat transfer member 310, and a lower heat transfer member 320 (although it will be appreciated that the two parts could be integral with one another, i.e. forming a single heat transfer member). It can be seen that the heat transfer member 300 has, been positioned to surround a lens 330. This may allow for more accurate control of the thermal profile of the lens 330, and thus correction of aberrations caused by uneven heating of the lens 330 by its transmission of a radiation beam.

Sides of the heat transfer member 300 which face the lens 330 may have a thermal profile which is to be transferred to the lens 300. The thermal profile can be established by heating the sides of the heat transfer member 300 which will face the lens 330, or by addressing heat sources provided on those sides (as described above). The sides which do not face the lens 300 may be provided with an insulation and/or heat reflecting layer, so that heat dissipated by the heat transfer member 300 is not dissipated in the direction of other lenses (not shown), for example lenses above and below the lens 330 in the Figure.

The heat transfer member may be moveable in any suitable manner. For example, the heat transfer member may be rotated into and out of position, or be moveable in a linear fashion, or a combination of the two.

While specific embodiments of the invention have been described above, it will be appreciated that the invention may be practiced otherwise than as described. The description is not intended to limit the invention, the invention being defined by the claims that follow.

The invention claimed is:

1. A projection system suitable for use in a lithographic apparatus, the projection system comprising:
   a transmissive optical element; and
   a thermal profile corrector configured to change a thermal profile of the transmissive optical element, the thermal profile corrector comprising a transfer member and a thermal profile conditioner, the transfer member being moveable into and out of proximity with the transmissive optical element to transfer a desired thermal profile from the thermal profile conditioner to the transmissive optical element.

2. A projection system as claimed in claim 1, wherein the thermal profile conditioner comprises at least one heating plate.

3. A projection system as claimed in claim 2, wherein the thermal profile conditioner comprises a pair of heating plates disposed in spaced apart arrangement relative to each other, such that the transfer member is disposable therebetween.

4. A projection system as claimed in claim 2, wherein the, or each, heating plate comprises an array of individually addressable electrical heaters.

5. A projection system as claimed in claim 4, wherein the individually addressable electrical heaters are arranged to transfer heat to selected discrete regions of the transfer member.

6. A projection system as claimed in claim 5, further comprising a controller configured to select the discrete regions for heat transfer.

7. A projection system as claimed in claim 6, wherein the controller is configured to select the discrete regions for heat transfer relative to a phase map of a patterned radiation beam.

8. A projection system as claimed in claim 6, wherein the controller is configured to select the discrete regions for heat transfer relative to a model of the projection system.

9. A projection system as claimed in claim 6, wherein the controller is disposed in, or adjacent to, the thermal profile conditioner.

10. A projection system as claimed in claim 1, wherein the thermal profile conditioner is provided with a cooling source.

11. A projection system as claimed in claim 1, wherein the transfer member comprises a plurality of heat sources.

12. A projection system as claimed in claim 11, wherein the heat sources are Light Emitting Diodes (LEDs), laser diodes or super luminescent diodes.

13. A projection system as claimed in claim 11, wherein the thermal profile conditioner comprises a controller configured to address each of the plurality of heat sources.

14. A projection system as claimed in claim 11, wherein the controller is configured to address the heat sources relative to a phase map of a patterned radiation beam.

15. A projection system as claimed in claim 11, wherein the controller is configured to select the heat sources relative to a model of the projection system.

16. A projection system as claimed in claim 1, wherein the transfer member includes a plurality of cooling sources.

17. A projection system as claimed in claim 1, wherein the projection system comprises two transmissive optical elements.

18. A projection system as claimed in claim 17, wherein the transfer member is moveable to and from a position between the two transmissive optical elements.

19. A projection system as claimed in claim 1, wherein the transfer member is moveable onto a pupil plane associated with the transmissive optical element.

20. A projection system as claimed in claim 1, further comprising a second transfer member.

21. A projection system as claimed in claim 20, wherein the transfer member and the second transfer member are moveable into and out of proximity with the transmissive optical element to transfer a desired thermal profile from the thermal profile conditioner into the transmissive optical element.

22. A projection system as claimed in claim 21, wherein the transfer member and the second transfer member are moveable into and out of proximity with the transmissive optical element, such that, when in proximity with the transmissive optical element, the transmissive optical element is located in-between the transfer member and the second transfer member.

23. A projection system as claimed in claim 1, wherein the transmissive optical element is a lens.

24. A projection system as claimed in claim 1, wherein the transmissive optical element is a flat piece of material transparent to radiation of certain wavelengths.

25. A lithographic apparatus comprising:
a support constructed to support a patterning device, the patterning device being capable of providing a patterned radiation beam;
a substrate table constructed to hold a substrate;
a projection system including a transmissive optical element, and configured to project the patterned radiation beam onto a target portion of the substrate; and
a thermal profile corrector configured to change a thermal profile of the transmissive optical element, the thermal profile corrector comprising a transfer member and a thermal profile conditioner, the transfer member being moveable into and out of proximity with the transmissive optical element to transfer a desired thermal profile from the thermal profile conditioner to the transmissive optical element.

26. A method of changing a thermal profile of a transmissive optical element, the method comprising:
transferring a predetermined thermal profile from a thermal profile conditioner to a transfer member; and
moving the transfer member into proximity with the transmissive optical element to transfer the thermal profile from the transfer member to the transmissive optical element.

27. A method as claimed in claim 26, further comprising controlling the thermal profile conditioner relative to a model of the transmissive optical element.

28. A method as claimed in claim 26, further comprising controlling the thermal profile conditioner relative to a phase map.

29. A method as claimed in claim 26, wherein the transfer member is disposed on a pupil plane associated with the transmissive optical element.

30. A method as claimed in claim 26, wherein the transfer member is moveable to and from a position located between two transmissive optical elements.

31. A method as claimed in claim 26, comprising transferring a predetermined thermal profile from a thermal profile conditioner to two transfer members.

32. A method as claimed in claim 31, further comprising moving the two transfer members to and from a position where the transmissive optical element is located in-between the two transfer members.

33. A method as claimed in claim 26, wherein the transfer member is moved into proximity with the transmissive optical element when radiation is not being transmitted through the transmissive optical element.

34. A method as claimed in claim 26, wherein the transmissive optical element is part of a projection system configured to project a patterned beam of radiation.

35. A method as claimed in claim 34, further comprising controlling the thermal profile conditioner relative to a model of the projection system.

* * * * *